(12) United States Patent
Zhu et al.

(10) Patent No.: US 11,086,070 B2
(45) Date of Patent: Aug. 10, 2021

(54) BACKLIGHT MODULE AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Chengbing Zhu, Beijing (CN); Xiaofei Zhu, Beijing (CN); Dayu Zhang, Beijing (CN); Zhuo Zhang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 234 days.

(21) Appl. No.: 16/336,800

(22) PCT Filed: Oct. 15, 2018

(86) PCT No.: PCT/CN2018/110193
§ 371 (c)(1),
(2) Date: Mar. 26, 2019

(87) PCT Pub. No.: WO2019/085730
PCT Pub. Date: May 9, 2019

(65) Prior Publication Data
US 2020/0341186 A1    Oct. 29, 2020

(30) Foreign Application Priority Data
Oct. 31, 2017    (CN) .......................... 201711048279.0

(51) Int. Cl.
*F21V 8/00*         (2006.01)
*F21V 29/508*       (2015.01)
(Continued)

(52) U.S. Cl.
CPC .......... *G02B 6/0085* (2013.01); *F21V 29/508* (2015.01); *F21V 29/70* (2015.01); *G06F 1/1609* (2013.01); *H05K 7/20963* (2013.01)

(58) Field of Classification Search
CPC ..... G02B 6/0085; F21V 29/508; F21V 29/70; G06F 1/1609; H05K 7/20963
See application file for complete search history.

(56) References Cited

U.S. PATENT DOCUMENTS

2010/0165239 A1    7/2010  Lee et al.
2012/0257136 A1*  10/2012  Horiuchi .......... G02F 1/133308
                                                    349/58
2017/0238446 A1    8/2017  Wu

FOREIGN PATENT DOCUMENTS

CN    101770103 A    7/2010
CN    104504998 A    4/2015
(Continued)

OTHER PUBLICATIONS

International Search Report and Written Opinion of the International Searching Authority (with English translation of Written Opinion), International Application No. PCT/CN2018/110193, dated Dec. 25, 2018, 12 pp.

(Continued)

*Primary Examiner* — Thomas M Sember
(74) *Attorney, Agent, or Firm* — Myers Bigel, P.A.

(57) ABSTRACT

A backlight module suitable for thermal coupling with a display panel includes a light guide plate which has a light incident surface and a light exiting surface, a light source configured such that light emitted therefrom enters the light guide plate from the light incident surface and exits the light guide plate from the light exiting surface to irradiate onto the display panel, a heat sink configured to partially accommodate the light guide plate and the light source, and a heat conducting device disposed between the heat sink and the (Continued)

display panel to conduct heat generated from the display panel to the heat sink. The backlight module can quickly dissipate heat generated from a heat concentrated area of the display panel to the outside.

18 Claims, 3 Drawing Sheets

(51) Int. Cl.
*F21V 29/70* (2015.01)
*G06F 1/16* (2006.01)
*H05K 7/20* (2006.01)

(56) References Cited

FOREIGN PATENT DOCUMENTS

| | | |
|---|---|---|
| CN | 105759498 A | 7/2016 |
| CN | 205787469 U | 12/2016 |
| CN | 205881357 U | 1/2017 |
| CN | 106405913 A | 2/2017 |
| CN | 206450921 U | 8/2017 |
| CN | 107763501 A | 3/2018 |
| JP | 2014-224939 A | 12/2014 |
| TW | I312886 B1 | 8/2009 |

OTHER PUBLICATIONS

First Review Notice and English language translation, CN Application No. 201711048279.0, dated Mar. 14, 2019, 7 pp.

\* cited by examiner

BACKLIGHT MODULE AND DISPLAY DEVICE

CROSS REFERENCE TO RELATED APPLICATIONS

The present application is a 35 U.S.C. 371 national stage application of PCT International Application No. PCT/CN2018/110193, filed on Oct. 15, 2018, which claims the benefit of Chinese Patent Application No. 201711048279.0 filed on Oct. 31, 2017, the contents of which are incorporated herein by reference in their entireties.

TECHNICAL FIELD

The present disclosure relates to the technical field of display, in particular to a backlight module and a display device.

BACKGROUND

A backlight module and a display panel are important components of a liquid crystal display, wherein the backlight module comprises a light source and a light guide plate for providing sufficient and uniform planar backlight for the liquid crystal display, and the display panel is used for displaying images. Generally, the backlight module is divided into two types: a side-incidence backlight module and a bottom-incidence backlight module. The side-incidence backlight module uses one side of the light guide plate as a light incident surface and a light bar located at the light incident surface as a light source, a light emitting surface of the light source is facing the light incident surface of the light guide plate, and the light emitted by the light source is exited from the light exiting surface (upper surface) of the light guide plate after being guided by the light guide plate and irradiated onto the liquid crystal panel for display. The bottom-incidence backlight module uses a bottom surface of the light guide plate as the light incident surface, the light source is located at the bottom surface of the light guide plate, the light enters the light guide plate from the bottom surface of the light guide plate, and after being guided by the light guide plate, the light exits from the light exiting surface (upper surface) of the light guide plate and irradiates onto the liquid crystal panel for display.

With the gradual increase of display resolution, the power consumption of the display panel is also increasing, thus causing heat generation of some areas (such as areas provided with integrated circuits) of the display panel to also increase. Hereinafter, for convenience of description, an area where the display panel has a large amount of heat generation will be referred to as a heat concentrated area. For example, an area provided with an integrated circuit of a display panel belongs to a heat concentrated area.

During operation, the temperature in the heat concentrated area of the display panel will generally reach above 42° C., which causes the display panel to be unable to meet the use requirements as a touch screen. Therefore, it is urgent to solve the heat dissipation problem in the heat concentrated area of the display panel. As well known, the display panel is generally assembled on the backlight module. To solve the heat dissipation problem in the heat concentrated area of the display panel, it is necessary to start with the thermal coupling mode between the display panel and the backlight module, so that the heat generated from the heat concentrated area of the display panel can be quickly dissipated from the backlight module to the outside. However, the current backlight module design cannot meet this requirement.

Therefore, there is an urgent need to provide an improved backlight module design that can quickly dissipate heat generated from a heat concentrated area of a display panel from the backlight module to the outside.

SUMMARY

In view of this, the present disclosure provides a backlight module suitable for thermal coupling with a display panel, comprising:

a light guide plate having a light incident surface and a light exiting surface;

a light source configured such that light emitted therefrom enters the light guide plate from the light incident surface and exits the light guide plate from the light exiting surface to irradiate onto the display panel;

a heat sink configured to partially accommodate the light guide plate and the light source; and a heat conducting device disposed between the heat sink and the display panel to conduct heat generated from the display panel to the heat sink.

According to one aspect of the present disclosure, the heat sink comprises a bottom surface for supporting the light guide plate, a side surface substantially parallel to the light incident surface and a top surface arranged on the light exiting surface. The bottom surface, the side surface and the top surface of the heat sink together define a U-shaped bending structure which partially encloses the bottom surface, the light incident surface and part of the light exiting surface adjacent to the light incident surface of the light guide plate.

According to one aspect of the present disclosure, the backlight module further includes a frame for supporting the display panel, which encloses the peripheral portion of the light guide plate not enclosed by the U-shaped bending structure.

According to one aspect of the present disclosure, the height of the top surface of the frame in the thickness direction of the light guide plate is greater than the height of the top surface of the U-shaped bending structure.

According to one aspect of the present disclosure, the thickness of the heat conducting device is substantially equal to the height difference between the top surface of the frame and the top surface of the U-shaped bending structure.

According to one aspect of the present disclosure, the heat conducting device comprises a filling member and a heat conducting member located on the top surface of the U-shaped bending structure, the heat conducting member comprising: a first section located on a surface of the filling member facing away from the U-shaped bending structure; a second section located on the top surface of the U-shaped bending structure and arranged side by side with the filling member; and a third section interposed between the first section and the second section, wherein the first section is adapted to be in thermal contact with the display panel, and the second section is adapted to be in thermal contact with the U-shaped bending structure.

According to one aspect of the present disclosure, the heat conducting member comprises a plurality of thermal conductive strips, and the positions of the plurality of thermal conductive strips on the filling member correspond to the positions of the heat concentrated areas of the display panel.

According to one aspect of the present disclosure, the heat conducting member is a thermal conductive pad, the heat sink comprises metal, and the filling member is an adhesive tape.

According to one aspect of the present disclosure, one side of the thermal conductive pad for thermal contact with the display panel is coated with a thermal conductive adhesive layer, and one side of the thermal conductive pad for thermal contact with the U-shaped bending structure is coated with a thermal conductive adhesive layer.

According to one aspect of the present disclosure, the adhesive tape is a double-sided adhesive tape coated with adhesive layers on both sides, and comprises two adhesive layers and a PET layer sandwiched between the two adhesive layers, and the two adhesive layers are respectively bonded to the thermal conductive pad and the U-shaped bending structure.

According to one aspect of the present disclosure, the adhesive tape is a single-sided adhesive tape coated with an adhesive layer on one side, and comprises a PET layer and an adhesive layer, wherein the adhesive layer is bonded to the U-shaped bending structure, and the PET layer is bonded to the thermal conductive adhesive layer of the thermal conductive pad.

According to one aspect of the present disclosure, the thermal conductive adhesive layer of the thermal conductive pad is colloid doped with high thermal conductive ceramic particles.

According to yet another aspect of the present disclosure, the colloid comprises at least one of the following materials: glass fiber and acrylic pressure sensitive adhesive; and acrylic polymer and silicone adhesive.

According to yet another aspect of the present disclosure, the thermal conductive pad comprises at least one of the following materials: thermal conductive rubber; thermal conductive silicone; and thermal conductive ceramics.

The disclosure also provides a display device, which comprises the backlight module described above and a display panel thermally coupled with the backlight module.

BRIEF DESCRIPTION OF THE DRAWINGS

In order to more clearly explain the technical solution in the embodiment of the present disclosure, the following will briefly introduce the drawings needed in the description of the embodiment. Obviously, the drawings in the following description are only some embodiments of the present disclosure, and for those of ordinary skill in the art, other embodiments can be obtained according to these drawings without creative efforts. It should be emphasized that the drawings are not necessarily drawn to scale, on the contrary, some element sizes or dimension proportional relationships may be exaggerated to highlight the innovation of the present disclosure.

DETAILED DESCRIPTION

In the following, the technical solution in the embodiment of the present disclosure will be clearly and completely described with reference to the drawings in the embodiment of the present disclosure. Obviously, the described embodiment is only a part of the embodiment of the present disclosure, not all of the embodiments. Based on the embodiments in the present disclosure, all other embodiments obtained by those of ordinary skill in the art without creative efforts are within the scope of protection in the present disclosure. Some embodiments may be described by using the expression "one embodiment" or "some embodiments" along with their derivatives. These terms mean that a particular feature, structure, or characteristic described in connection with an embodiment is included in at least one embodiment. The phrase "in one embodiment" appearing in various places in the application does not necessarily all refer to the same embodiment.

Unless otherwise defined, all technical and scientific terms used in this specification have the same meaning as commonly understood by those skilled in the art to which this disclosure belongs. The words "first", "second", "third" and the like are only used as labels to distinguish elements and are not intended to impose numerical and order requirements on their objects. It should be understood that the terms so used are interchangeable under appropriate circumstances and that the embodiments of the present disclosure described herein are capable of operation in a different order than described or illustrated herein.

Figure 1:
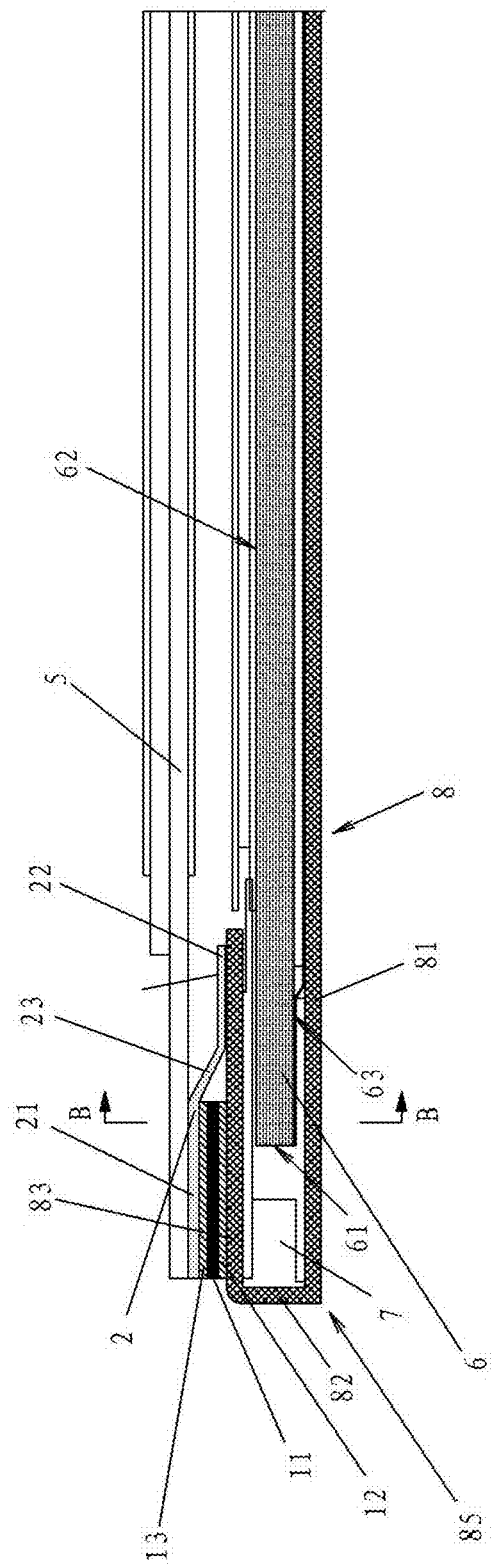
FIG. 1 is a partial structural schematic view of a backlight module and a display panel located thereon according to one embodiment of the present disclosure.
Figure 2:
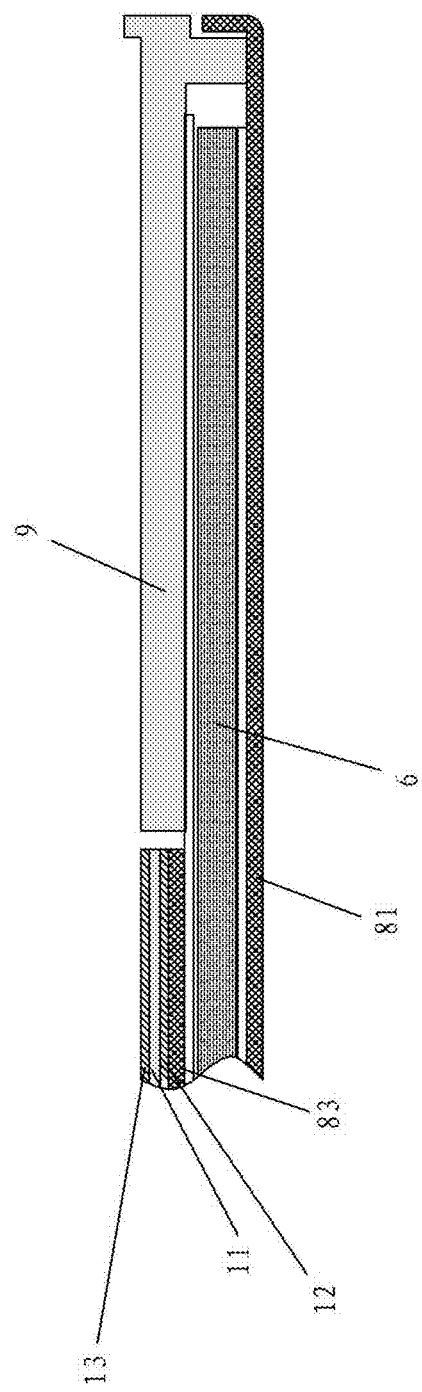
FIG. 2 schematically shows a partial cross-sectional view along B-B in FIG. 1, wherein the display panel and the heat conducting device are omitted for the sake of clarity, and a frame not shown in FIG. 1 is introduced.

Referring to FIG. 1 and FIG. 2, a backlight module according to some embodiments of the present disclosure includes a light guide plate 6, a light source 7, a heat sink 8, and a heat conducting device 3. The light source 7 is disposed adjacent to a light incident surface 61 of the light guide plate 6. The light incident surface 61 is an upright side surface of the light guide plate 6. A light emitting surface of the light source 7 faces the light incident surface 61 of the light guide plate 6. The light emitted by the light source 7 is guided by the light guide plate 6 and then exited from a light exiting surface 62 (upper surface in FIG. 1) of the light guide plate 6 to irradiate onto the display panel 5 for display. The heat conducting device 3 (including a filling member 1 and a heat conducting member 2) as a whole serves as a good thermal conductor, rapidly conducts heat generated by the display panel 5 to the heat sink 8, and then dissipates the heat to the surrounding environment so as to rapidly cool the display panel 5.

The light guide plate 6 has a substantially parallelepiped shape, and has an upright light incident surface 61, as well as a light exiting surface 62 and a bottom surface 63 opposite to each other. It should be noted that, for the sake of simplicity, FIG. 1 illustrates a side-incidence backlight module as an example, but it should be understood that the backlight module of the present disclosure can also be a bottom-incidence backlight module, and only the light source 7 located at the light incident surface 61 of the light guide plate 6 in FIG. 1 needs to be moved to the bottom surface 63 of the light guide plate 6.

The light source 7 may be a cold cathode fluorescent lamp (CCFL) or an LED strip. The light source 7 is configured such that light emitted from the light source 7 enters the light guide plate 6 from the light incident surface 61 of the light guide plate 6, exits the light guide plate 6 from the light exiting surface 62 of the light guide plate 6 after being uniformly mixed inside the light guide plate 6 to irradiate onto the display panel 5 for display.

The heat sink 8 is made of a good thermal conductive material, for example, a metal (for example, iron) having a certain strength and rigidity. In addition to rapidly dissipating heat generated by the display panel 5 into the surrounding environment through heat conduction by the heat conducting device 3, the heat sink 8 is also used to support the light guide plate 6 and the light source 7, and uses its bottom surface 81 to re-reflect light escaping from the bottom surface 63 of the light guide plate 6 back into the light guide plate 6 to improve the utilization rate of light. In other words, the shape of the heat sink 8 at the side of the light incident surface 61 of the light guide plate 6 is generally a U-shaped bent shape (hereinafter referred to as a U-shaped bending structure) with an opening toward the light incident surface 61, and its function is to reflect the light emitted from the light source back into the light guide plate as much as possible to improve the light utilization efficiency.

The heat sink 8 is configured to partially accommodate the light guide plate 6 and the light source 7. As shown in FIG. 1, the heat sink 8 includes a bottom surface 81 for supporting the light guide plate 6, an upright side surface 82 substantially parallel to the light incident surface 61 of the light guide plate 6, and a top surface 83 provided on the light exiting surface 62 of the light guide plate 6. The distance that the top surface 83 of the heat sink 8 extends over the light exiting surface 62 of the light guide plate 6 in a direction perpendicular to the light incident surface 61 of the light guide plate 6 is smaller than the distance that the bottom surface 81 of the heat sink 8 extends under the bottom surface 63 of the light guide plate 6 in a direction perpendicular to the light incident surface 61 of the light guide plate 6. In other words, the area of the top surface 83 of the heat sink 8 covering the light exiting surface 62 of the light guide plate 6 is smaller than the area of the bottom surface 81 of the heat sink 8 covering the bottom surface 63 of the light guide plate 6.

The bottom surface 81, the side surface 82 and the top surface 83 of the heat sink 8 together define a U-shaped bending structure 85, which encloses the bottom surface 63, the light incident surface 61 and part of the light exiting surface 62 adjacent to the light incident surface 61 of the light guide plate 6.

The heat conducting device 3 includes a filling member 1 and a heat conducting member 2 located on the top surface 83 of the U-shaped bending structure. The heat conducting device 3 is disposed between the heat sink 8 and the display panel 5 to conduct heat generated from the display panel 5 to the heat sink 8. The filling member 1 is introduced to reduce the production cost of the heat conducting device 3, because the price of the filling member 1 is much lower than that of the heat conducting member 2 (especially the thermal conductive adhesive 21), and is usually made of a poor thermal conductive material, such as adhesive tape. Although the adhesive tape is a poor thermal conductor, the introduction of the adhesive tape is not conducive to heat dissipation and heat conduction between the display panel and the U-shaped bending structure, but it can significantly reduce the cost. At the same time, since the heat conducting member 2 (especially it also includes the thermal conductive adhesive 21) is made of a good thermal conductor, the heat conducting device 3 including the filling member 1 and the heat conducting member 2 according to the present disclosure not only can meet the requirements of heat dissipation and heat conduction between the display panel 5 and the U-shaped bending structure 85, but also has cost advantage and good market competitiveness.

The heat conducting member 2 of the heat conducting device 3 includes: a first section 21 located on a surface of the filling member 1 facing away from the U-shaped bending structure 85; a second section 22 located on the top surface 83 of the U-shaped bending structure 85 and arranged side by side with the filling member 1; and, a third section 23 interposed between the first section 21 and the second section 22, wherein the first section 21 is adapted to be in thermal contact with the display panel 5 and the second section 22 is adapted to be in thermal contact with the top surface 83 of the U-shaped bending structure 85.

According to some embodiments of the present disclosure, referring to FIG. 2, the backlight module further includes a frame 9 for supporting the display panel 5, which encloses the peripheral portion of the light guide plate 6 that is not enclosed by the U-shaped bending structure 85. Generally, in the thickness direction of the light guide plate 6, the height of the top surface of the frame 9 is greater than the height of the top surface 83 of the U-shaped bending structure 85. For convenience of description, the height difference between the top surface of the frame 9 and the top surface 83 of the U-shaped bending structure 85 will be referred to as a level difference. Due to the presence of the level difference, the display panel 5 cannot be stably supported on the frame 9, which easily causes damage to the display panel 5 or even risks of breakage. In the backlight module according to some embodiments of the present disclosure, the heat conducting device 3 is provided in an area corresponding to the level difference on the top surface 83 of the U-shaped bending structure 85 (only the filling member 1 is shown in FIG. 2 and the heat conducting member 2 is not shown for simplicity). Optionally, the thickness of the heat conducting device 3 is approximately the height difference between the top surface of the frame 9 and the top surface 83 of the U-shaped bending structure 85. By arranging the heat conducting device 3, the level difference between the top surface of the frame 9 and the top surface 83 of the U-shaped bending structure 85 is well filled up, so that the display panel 5 can be stably supported by the frame 9 and the heat conducting device 3. In this way, the display panel 5 is effectively protected, and the service life of the display panel 5 is extended.

Figure 3:
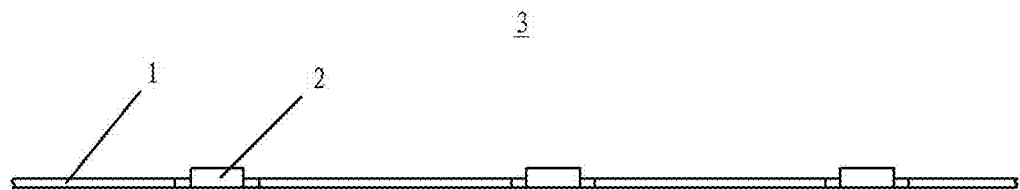
FIG. 3 is a partial structural schematic view of a heat conducting device in a backlight module according to one embodiment of the present disclosure.
Figure 4:
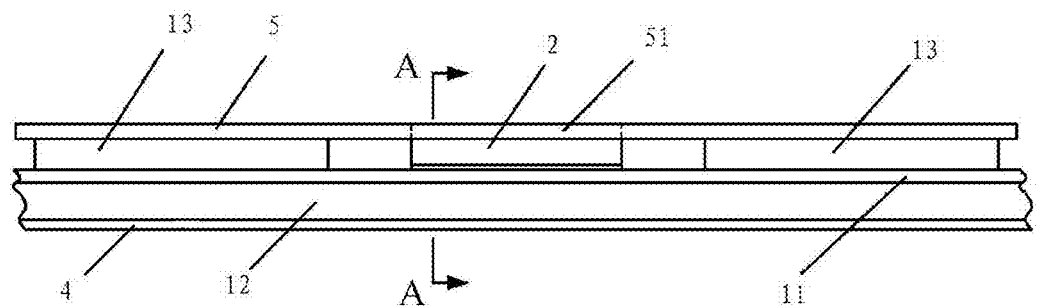
FIG. 4 is a partial structural schematic view of a backlight module and a display panel located thereon according to one embodiment of the present disclosure.
Figure 5:
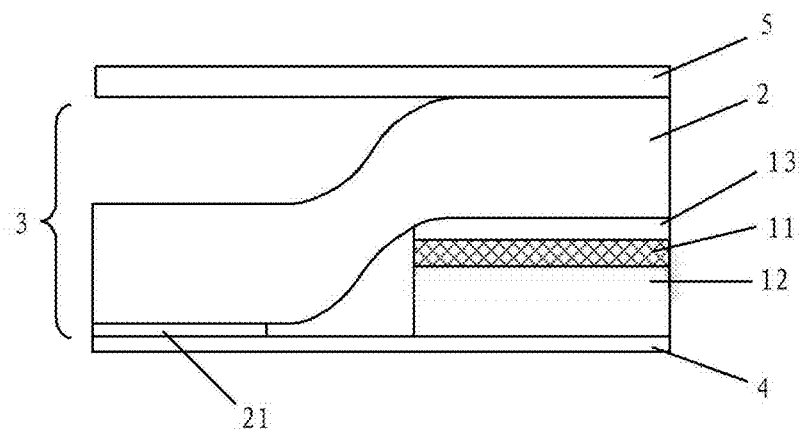
FIG. 5 schematically shows a cross-sectional view along A-A in FIG. 4.

According to some embodiments of the present disclosure, referring to FIGS. 3-5, the heat conducting member 2 of the heat conducting device 3 includes a plurality of thermal conductive strips (in the local heat conducting device 3 shown in FIG. 3, there are three thermal conductive strips), and the positions of the plurality of thermal conductive strips on the filling member 1 correspond to the positions of the heat concentrated areas (e.g., is the areas where the integrated circuits are located) of the display panel 5. The heat conducting member 2 is, for example, a thermal conductive pad made of a good thermal conductive material. The thermal conductive pad is made of at least one of the following materials: thermal conductive rubber; thermal conductive silicone; and thermal conductive ceramics.

Further, a side of the thermal conductive pad for thermal contact with the display panel 5 is coated with the thermal conductive adhesive layer 21, and the side of the thermal conductive pad for thermal contact with the top surface 83 of the U-shaped bending structure 85 is also coated with the thermal conductive adhesive layer 21 (see FIG. 5). The thermal conductive adhesive layer 21 of the thermal conductive pad is colloid doped with high thermal conductive ceramic particles. For example, the colloid comprises at least one of the following materials: glass fiber and acrylic pressure sensitive adhesive; and acrylic polymer and silicone adhesive.

Referring to FIG. 1, FIG. 2, FIG. 4 and FIG. 5 together, according to some embodiments of the present disclosure, the filling member 1 is an adhesive tape, and the adhesive tape is a double-sided adhesive tape coated with adhesive layers on both sides, which includes two adhesive layers 12 and 13 and a PET layer 11 sandwiched between the two adhesive layers 12 and 13, and the two adhesive layers 12 and 13 are respectively bonded to the thermal conductive pad and the U-shaped bending structure 85.

Referring to FIG. 3, according to some embodiments of the present disclosure, the filling member 1 is an adhesive tape, and the adhesive tape is a single-sided adhesive tape coated with an adhesive layer on one side, which comprises a PET layer 11 and a lower adhesive layer 12, wherein the adhesive layer 12 is bonded to the U-shaped bending structure 85, and the PET layer 11 is bonded to the thermal conductive adhesive layer 21 of the thermal conductive pad.

During assembly, the light source 7 and the light guide plate 6 are first assembled into the heat sink 8 so that the light source 7 and the light guide plate 6 are partially accommodated by the heat sink 8. Then, the frame 9 encloses the peripheral portion of the light guide plate 6 that is not enclosed by the U-shaped bending structure 85. Finally, the heat conducting device 3 is provided in an area corresponding to the above-mentioned level difference on the top surface 83 of the U-shaped bending structure 85 of the heat sink 8. Since the heat conducting device 3 includes a thermal conductive pad made of good thermal conductive material, especially the thermal conductive pad includes a thermal conductive adhesive layer 21 made of good thermal conductive material, heat generated in the display panel 5 is quickly conducted to the heat sink 8 through the heat conducting device 3 and dissipated from the heat sink to the surrounding environment.

Experiments prove that by arranging the heat conducting device 3, the temperature of the heat concentrated area of the display panel 5 can be reduced from above 42° C. to below 40° C., so that a human hand can be placed on the display panel 5 to touch, and the display panel 5 can meet the requirement of acting as a touch screen.

Alternatively, the heat conducting member 2 may be provided only in the heat concentrated area of the display panel 5, and the heat conducting member 2 may not be provided in the non-heat concentrated area of the display panel 5. Instead, the inexpensive filling member 1 (e.g., a double-sided adhesive tape) may be used in the non-heat concentrated area of the display panel 5. The production cost of the whole backlight module is further reduced.

On the other hand, by using the double-sided adhesive tape, the backlight module can be prevented from being separated from the display panel 5 during transportation or use, that is, the fixation of the display panel 5 can be achieved, and the stability of the entire display device is improved.

On the other hand, while thermally coupling the display panel 5 and the heat sink 8 well, the above-mentioned specific heat-conducting device 3 including the filling member 1 and the heat-conducting member 2 has been proved by experiments to be beneficial to prevent the display device from generating light leakage, non-uniform display brightness (mura) or spot marks.

The present disclosure also provides a display device including the backlight module described above and a display panel 5 thermally coupled to the backlight module.

In the display device provided according to one aspect of the present disclosure, the heat conducting device 3 is provided at a position corresponding to a heat concentrated area of the display panel 5, and the thermal conductive pad is provided in the heat conducting device 3 to rapidly transfer heat of the display panel to the heat sink 8, thereby solving the problem that the display panel cannot meet the use requirement as a touch screen due to poor heat dissipation and high temperature of the display panel itself.

The embodiment of the disclosure also provides a display device, which comprises a display panel and any of the backlight modules in the above embodiments.

Those skilled in the art will understand the term "substantially" herein (such as in "substantially all" or in "substantially consisting of") may also include embodiments is having "wholly," "completely," "all," etc. Therefore, in the embodiment, the adjective is also substantially removable. Where applicable, the term "substantially" may also refer to 90% or more, such as 95% or more, specifically 99% or more, even more specifically 99.5% or more, including 100%. The term "comprising" also includes embodiments in which the term "comprising" means "consisting of". The term "and/or" specifically refers to one or more of the items mentioned before and after "and/or". For example, the phrase "item 1 and/or item 2" and similar phrases may relate to one or more of items 1 and 2. The term "comprising" may refer to "consisting of" in one embodiment, but may also refer to "including at least a defined category and optionally one or more other categories" in another embodiment.

Among other things, the systems, equipment and devices herein are described during operation. As will be clear to those skilled in the art, the present disclosure is not limited to methods of operation and devices in operation.

It should be noted that the above-mentioned embodiments illustrate rather than limit the present disclosure, and that those skilled in the art will be able to design many alternative embodiments without departing from the scope of the appended claims. In the claims, any reference signs placed between parentheses shall not be construed as limiting the claims. The use of the verb "to include" and its conjugations does not exclude the presence of elements or steps other than those stated in a claim. The article "a" or "an" preceding an element does not exclude the presence of a plurality of such elements. The present disclosure may be implemented by means of hardware comprising several distinct elements, and by means of a suitably programmed computer. In the device claim enumerating several devices, several of these devices can be embodied by the same item of hardware. The mere fact that certain measures are recited in mutually different dependent claims does not indicate that a combination of these measures cannot be used to advantage.

The present disclosure is further applicable to devices that include one or more of the characterizing features described in this specification and/or shown in the drawings. The present disclosure further relates to methods or processes that include one or more of the characterizing features described in this specification and/or shown in the drawings.

The various aspects discussed in this application may be combined to provide additional advantages. In addition, those skilled in the art will understand that embodiments can be combined, and more than two embodiments can also be combined. In addition, some features may form the basis of one or more divisional applications.

In this context, specific examples are applied to explain the principle and implementation of the present disclosure. The above embodiments are only used to help understand the method of the present disclosure and its core ideas. At the same time, for those of ordinary skill in this field, there will be changes in the specific implementation and application scope according to the idea of this disclosure. To sum up, the contents of this specification should not be construed as limiting the disclosure.

The invention claimed is:

1. A backlight module suitable for thermal coupling with a display panel comprising:
a light guide plate comprising a light incident surface and a light exiting surface;
a light source configured such that light emitted therefrom enters the light guide plate from the light incident surface and exits the light guide plate from the light exiting surface to irradiate onto the display panel;
a heat sink configured to partially accommodate the light guide plate and the light source; and
a heat conducting device between the heat sink and the display panel that is configured to conduct heat generated from the display panel to the heat sink;
wherein a bottom surface, a side surface and a top surface of the heat sink together define a U-shaped bending structure,
wherein the heat conducting device comprises a filling member and a heat conducting member on the top surface of the U-shaped bending structure,
wherein the heat conducting member comprises a first section on a surface of the filling member facing away from the U-shaped bending structure, a second section on the top surface of the U-shaped bending structure and side by side with the filling member, and a third section interposed between the first section and the second section,
wherein the first section is configured to be in thermal contact with the display panel, and
wherein the second section is configured to be in thermal contact with the U-shaped bending structure.

2. The backlight module according to claim 1, wherein the bottom surface of the heat sink supports the light guide plate, the side surface of the heat sink is substantially parallel to the light incident surface, and the top surface of the heat sink is on the light exiting surface, and
wherein the U-shaped bending structure partially encloses the bottom surface, the light incident surface and part of the light exiting surface adjacent to the light incident surface of the light guide plate.

3. The backlight module according to claim 2, further comprising:
a frame for supporting the display panel, which encloses a peripheral portion of the light guide plate not enclosed by the U-shaped bending structure.

4. The backlight module according to claim 3, wherein a height of a top surface of the frame in a thickness direction of the light guide plate is greater than a height of a top surface of the U-shaped bending structure.

5. The backlight module according to claim 4, wherein a thickness of the heat conducting device is substantially equal to a height difference between the top surface of the frame and the top surface of the U-shaped bending structure.

6. A display device comprising:
the backlight module according to claim 2; and
a display panel thermally coupled to the backlight module.

7. A display device comprising:
the backlight module according to claim 3; and
a display panel thermally coupled to the backlight module.

8. A display device comprising:
the backlight module according to claim 4; and
a display panel thermally coupled to the backlight module.

9. A display device comprising:
the backlight module according to claim 5; and
a display panel thermally coupled to the backlight module.

10. The backlight module according to claim 1,
wherein the heat conducting member comprises a plurality of thermal conductive strips, and
wherein positions of the plurality of thermal conductive strips on the filling member correspond to positions of heat concentrated areas of the display panel.

11. The backlight module according to claim 1, wherein the heat conducting member comprises a thermal conductive pad, the heat sink comprises metal, and the filling member comprises an adhesive tape.

12. The backlight module according to claim 11,
wherein a first side of the thermal conductive pad for thermal contact with the display panel is coated with a thermal conductive adhesive layer, and a second side of the thermal conductive pad for thermal contact with the U-shaped bending structure is coated with a thermal conductive adhesive layer.

13. The backlight module according to claim 11,
wherein the adhesive tape comprises a double-sided adhesive tape coated with adhesive layers on both sides, and comprises two adhesive layers and a PET layer between the two adhesive layers, and
wherein the two adhesive layers are respectively bonded to the thermal conductive pad and the U-shaped bending structure.

14. The backlight module according to claim 12,
wherein the adhesive tape comprises a single-sided adhesive tape coated with an adhesive layer on a first side of the adhesive tape, and comprises a PET layer and an adhesive layer,
wherein the adhesive layer is bonded to the U-shaped bending structure, and
wherein the PET layer is bonded to the thermal conductive adhesive layer of the thermal conductive pad.

15. The backlight module according to claim 12, wherein the thermal conductive adhesive layer of the thermal conductive pad comprises a colloid doped with high thermal conductive ceramic particles.

16. The backlight module according to claim 15, wherein the colloid comprises at least one of the following materials: glass fiber and acrylic pressure sensitive adhesive, acrylic polymer, or silicone adhesive.

17. The backlight module according to claim 11, wherein the thermal conductive pad comprises at least one of the following materials: thermal conductive rubber, thermal conductive silicone, or thermal conductive ceramics.

18. A display device comprising:
the backlight module according to claim 1; and
a display panel thermally coupled to the backlight module.

* * * * *